(12) United States Patent
Choi

(10) Patent No.: US 7,898,317 B2
(45) Date of Patent: Mar. 1, 2011

(54) CIRCUIT FOR GENERATING NEGATIVE VOLTAGE AND A SEMICONDUCTOR MEMORY APPARATUS USING THE SAME

(75) Inventor: Hong-Sok Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 57 days.

(21) Appl. No.: 12/347,366

(22) Filed: Dec. 31, 2008

(65) Prior Publication Data

US 2010/0039166 A1 Feb. 18, 2010

(30) Foreign Application Priority Data

Aug. 13, 2008 (KR) .................. 10-2008-0079625

(51) Int. Cl.
*G05F 1/10* (2006.01)
(52) U.S. Cl. .................. 327/535; 327/538
(58) Field of Classification Search .............. 327/535
See application file for complete search history.

(56) References Cited

U.S. PATENT DOCUMENTS

| 5,396,114 | A | 3/1995 | Lee et al. |
| 6,741,504 | B2 | 5/2004 | Van De Graaff |
| 7,015,684 | B2 | 3/2006 | Chen |

FOREIGN PATENT DOCUMENTS

| KR | 1020050052634 A | 6/2005 |
| KR | 1020060122574 | 11/2006 |

*Primary Examiner* — Lincoln Donovan
*Assistant Examiner* — Ryan C Jager
(74) *Attorney, Agent, or Firm* — Baker & McKenzie LLP

(57) ABSTRACT

A circuit for generating negative voltage includes a variable period oscillator configured to generate an oscillator signal enabled in response to a detection signal and to determine a period of the oscillator signal in response to a control signal, a pump configured to perform pumping operations in response to the oscillator signal and to generate a negative voltage by the pumping operations, a negative voltage detecting unit configured to detect the level of the negative voltage to generate the detection signal, and a gate-induced drain leakage current detecting unit configured to measure the amount of a gate-induced drain leakage current to generate the control signal.

22 Claims, 6 Drawing Sheets

US 7,898,317 B2

CIRCUIT FOR GENERATING NEGATIVE VOLTAGE AND A SEMICONDUCTOR MEMORY APPARATUS USING THE SAME

CROSS-REFERENCES TO RELATED APPLICATION

The present application claims priority under 35 U.S.C. §119(a) to Korean application number 10-2008-0079625, filed on Aug. 13, 2008, in the Korean Intellectual Property Office, which is incorporated herein by reference in its entirety as if set forth in full.

BACKGROUND OF THE INVENTION

1. Technical Field

The present invention relates to a semiconductor memory apparatus, and more particularly, to a circuit for generating negative voltage and a semiconductor memory apparatus using the same.

2. Related Art

FIG. 1 is a schematic block diagram of a conventional circuit for generating negative voltage. in FIG. 1, a circuit 1 for generating negative voltage includes a detecting unit 10, an oscillator 20, and a pump 30.

The detecting unit 10 enables a detection signal 'det' when the level of negative voltage VBB becomes higher than a target level. Conversely, the detecting unit 10 disables the detection signal 'det' when the level of the negative voltage VBB becomes lower than the target level.

The oscillator 20 generates an oscillator signal 'OSC' in response to the detection signal 'det'. For example, when the detection signal 'det' is enabled, the oscillator 20 generates the oscillator signal 'OSC'. When the detection signal 'det' is disabled, the oscillator 20 fixes the oscillator signal 'OSC' to a specific level.

The pump 30 performs pumping operations in response to the oscillator signal 'OSC', and generates the negative voltage VBB by pumping operations. Here, the pump 30 is constructed to perform pumping operations synchronous to the time when the oscillator signal 'OSC' transitions from high level to low level or from low level to high level.

The generated negative voltage VBB is supplied to a bulk node of an NMOS transistor that generally includes a word line driver or a cell transistor array.

Due to voltages individually supplied to a gate terminal or a drain terminal of the NMOS transistor, a gate-induced drain leakage (GIDL) current may flow from the drain region or the gate terminal to the bulk node. Due to the gate-induced drain leakage current, the level of the negative voltage VBB may increase. More specifically, if the amount of the gate-induced drain leakage current becomes larger than the current supply capability of the pump 30, then the negative voltage VBB increases without maintaining the target level. The gate-induced drain leakage current is a leakage current flowing between a drain region and a bulk node of the NMOS transistor due to hole components of electron-hole pairs (EHPs), which are generated in the drain region when electric fields of a gate terminal and the drain region of an NMOS transistor in a turned-OFF state are strengthened.

SUMMARY

A circuit for generating negative voltage, capable of constantly maintaining a current supply capability of negative voltage, and a semiconductor memory apparatus using the same are described herein.

In one aspect, a circuit for generating negative voltage includes a variable period oscillator configured to generate an oscillator signal enabled in response to a detection signal and to determine a period of the oscillator signal in response to a control signal, a pump configured to perform pumping operations in response to the oscillator signal and to generate a negative voltage by the pumping operations, and a negative voltage detecting unit configured to detect the level of the negative voltage to generate the detection signal.

In another aspect, a circuit for generating negative voltage includes a variable period oscillator configured to generate an oscillator signal enabled in response to a detection signal and to determine the period of the oscillator signal in response to a control signal, a pump configured to perform pumping operations in response to the oscillator signal and to generate a negative voltage by the pumping operations, a first detecting unit configured to enable the detection signal when the level of the negative voltage becomes higher than a first target level, and a second detecting unit configured to enable the control signal when the level of the negative voltage becomes higher than a second target level.

In another aspect, a semiconductor memory apparatus includes a circuit for generating negative voltage having a variable period oscillator configured to generate an oscillator signal enabled in response to a detection signal and to determine a period of the oscillator signal in response to a control signal, a pump configured to perform pumping operations in response to the oscillator signal and to generate a negative voltage by the pumping operations, and a negative voltage detecting unit configured to detect the level of the negative voltage to generate the detection signal.

In another aspect, a circuit for generating negative voltage a variable period oscillator configured to generate an oscillator signal enabled in response to a detection signal and to determine a period of the oscillator signal in response to a control signal, a pump configured to perform pumping operations in response to the oscillator signal and to generate a negative voltage by the pumping operations, a negative voltage detecting unit configured to detect the level of the negative voltage to generate the detection signal, a transistor configured to enable the control signal when the amount of the gate-induced drain leakage current output from a bulk node of the transistor becomes larger than a predetermined amount, an inverter configured to be connected to the bulk node of the transistor and to output the control signal, and a current source configured to constantly leak a part of a current that flows through a node to which the transistor and the inverter are connected to a ground terminal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
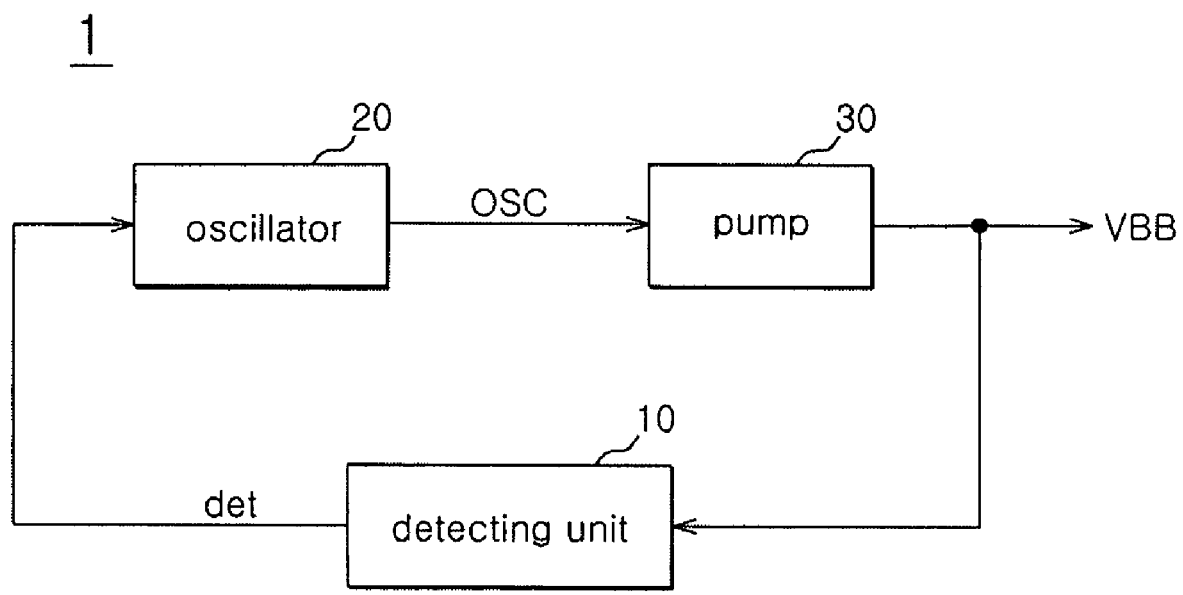
FIG. 1 is a schematic block diagram of a conventional circuit for generating negative voltage.
Figure 2:
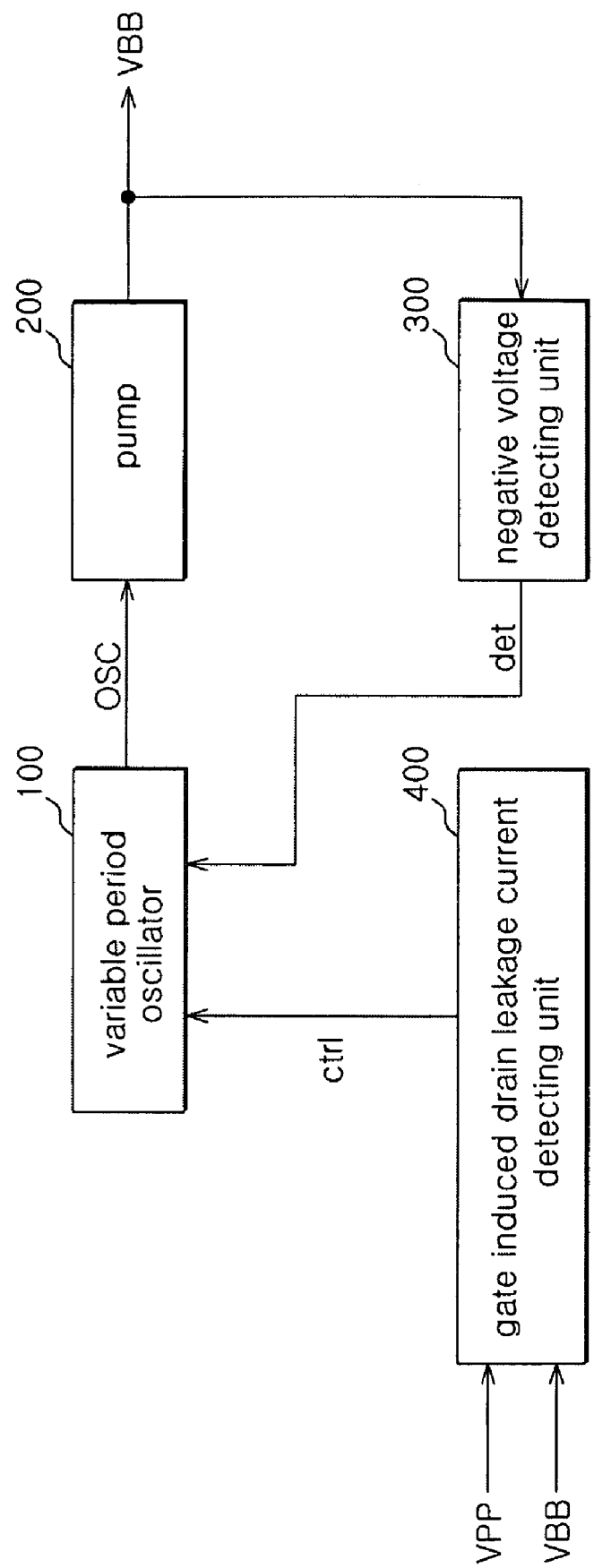
FIG. 2 is a schematic block diagram of an exemplary circuit for generating negative voltage of a semiconductor memory apparatus according to one embodiment.

FIG. 2 is a schematic block diagram of an exemplary circuit 2 for generating negative voltage of a semiconductor memory apparatus according to one embodiment. In FIG. 2, the circuit 2 for generating negative voltage of a semiconductor memory apparatus can be configured to include a variable period oscillator 100, a pump 200, a negative voltage detecting unit 300, and a gate-induced drain leakage current detecting unit 400.

The variable period oscillator 100 can generate an oscillator signal 'OSC' in response to a detection signal 'det', and can determine the period of the oscillator signal 'OSC' in response to a control signal 'ctrl'. For example, when the detection signal 'det' is enabled, the variable period oscillator 100 can generate the oscillator signal 'OSC'. When the variable period oscillator 100 generates the oscillator signal 'OSC' as an output, the variable period oscillator 100 can be considered to be enabled. Moreover, when the control signal 'ctrl' is enabled, the variable period oscillator 100 can generate the oscillator signal 'OSC' having a period shorter than when the control signal 'ctrl' is disabled.

The pump 200 can perform pumping operations in response to the oscillator signal 'OSC', and can generate a negative voltage VBB by the pumping operations. For example, the pump 200 can perform the pumping operations when the oscillator signal 'OSC' transitions from high level to low level or from low level to high level.

The negative voltage detecting unit 300 can detect the level of the negative voltage VBB to generate the detection signal 'det'. For example, the negative voltage detecting unit 300 can enable the detection signal 'det' when the level of the negative voltage VBB becomes higher than a target level.

The gate-induced drain leakage current detecting unit 400 can measure the amount of a gate-induced drain leakage current to generate the control signal 'ctrl'. Accordingly, electric fields are generated due to the voltages that are individually supplied to a gate terminal and a drain region of an NMOS transistor. Here, the gate-induced drain leakage (GIDL) current can be modeled and measured to generate the control signal 'ctrl' by the result of measurement. For NMOS transistors comprising semiconductor memory apparatuses, a gate-induced drain leakage (GIDL) current can be generated in an NMOS transistor to which a negative voltage is supplied as a bulk voltage. The gate-induced drain leakage current becomes a cause to raise the level of the negative voltage VBB supplied to the bulk node. Thus, since the level of the negative voltage VBB rises as the amount of the gate-induced drain leakage current increases, measurement of the level of the negative voltage VBB can be achieved by measuring the gate-induced drain leakage current instead. As a result, the gate-induced drain leakage current detecting unit 400 may be a negative voltage detecting unit, for example.

Figure 3:
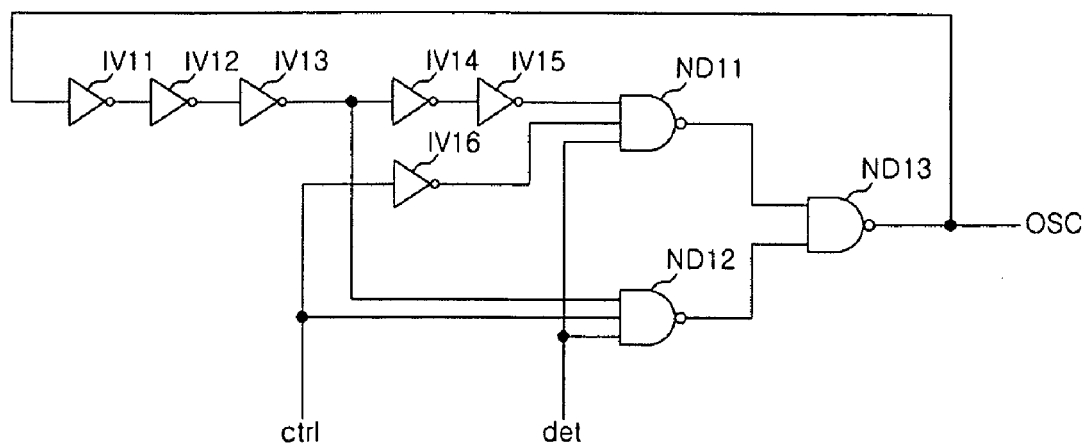
FIG. 3 is a schematic circuit diagram of an exemplary variable period oscillator capable of being implemented in the circuit of FIG. 2 according to one embodiment.

FIG. 3 is a schematic circuit diagram of an exemplary variable period oscillator 100 capable of being implemented in the circuit of FIG. 2 according to one embodiment. In FIG. 3, the variable period oscillator 100 can be configured to include a first to sixth inverters IV11 to IV16, and first to third NAND gates ND11 to ND13. The first inverter IV11 can receive the oscillator signal 'OSC' as an input, and the second inverter IV12 can receive the output signal of the first inverter IV11 as an input. The third inverter IV13 can receive the output signal of the second inverter IV12 as an input, and the fourth inverter IV14 can receive the output signal of the third inverter IV13 as an input. The fifth inverter IV15 can receive the output signal of the fourth inverter IV14 as an input, and the sixth inverter IV16 can receive the control signal 'ctrl' as an input.

The first NAND gate ND11 can receive the output signal of the fifth inverter IV15, the output signal of the sixth inverter IV16, and the detection signal 'det' as inputs. The second NAND gate ND12 can receive the output signal of the third inverter IV13, the control signal 'ctrl', and the detection signal 'det' as inputs. The third NAND gate ND13 can receive the output signal of the first NAND gate ND11 and the output signal of the second NAND gate ND12 as inputs, and can output the oscillator signal 'OSC'.

In FIG. 3, when the detection signal 'det' is disabled to a low level, the output signals of the first and second NAND gates ND11 and ND12 can be output at a fixed high level. Then, the third NAND gate ND13 can output a signal at a fixed low level. For example, when the detection signal 'det' is disabled to a low level, the variable period oscillator 100 can output a signal fixed only at a low level. When the detection signal 'det' is enabled to a high level and the control signal 'ctrl' is disabled to a low level, the second NAND gate ND12 can output an output signal of high level. Then, the first NAND gate ND11 and the third NAND gate ND13 can perform inverting operations that invert input signals.

Thus, when the detection signal 'det' is enabled to a high level and the control signal 'ctrl' is disabled to a low level, the oscillator signal 'OSC' can be generated though the first to fifth inverters IV11 to IV15 and the first and third NAND gates ND11 and ND13. Moreover, when the detection signal 'det' is enabled to a high level and the control signal 'ctrl' is enabled to a high level, the first NAND gate ND11 can output an output signal of high level. Then, the second NAND gate ND12 and the third NAND gate ND13 can perform inverting operations that invert input signals.

Thus, when the detection signal 'det' is enabled to a high level and the control signal 'ctrl' is enabled to a high level, the oscillator signal 'OSC' can be generated though the first to third inverters IV11, IV12 and IV13 and the second and third NAND gates ND12 and ND13. As a result, when the detection signal 'det' is enabled to a high level and the control signal 'ctrl' is enabled to a high level, the variable period oscillator 100 can generate the oscillator signal 'OSC' of a period shorter than when the control signal 'ctrl' is disabled to a low level.

Figure 4:
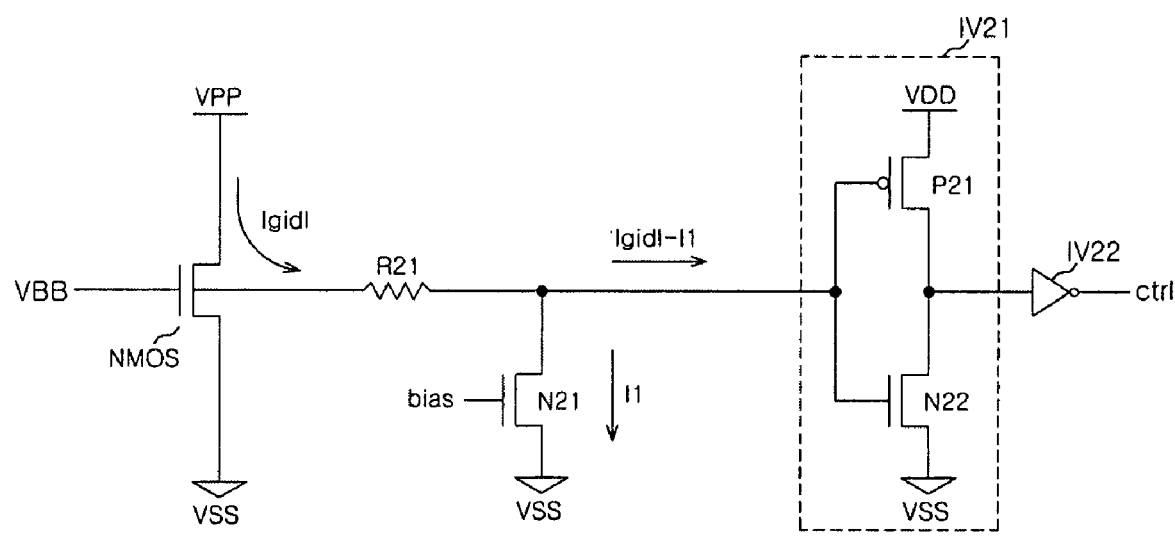
FIG. 4 is a schematic circuit diagram of an exemplary gate-induced drain leakage current detecting unit capable of being implemented in the circuit of FIG. 2 according to one embodiment.

FIG. 4 is a schematic circuit diagram of an exemplary gate-induced drain leakage current detecting unit 400 capable of being implemented in the circuit of FIG. 2 according to one embodiment. In FIG. 4, the gate-induced drain leakage current detecting unit 400 can be configured to include an NMOS transistor NMOS, a first transistor N21, a resistor element R21, and seventh and eighth inverters IV21 and IV22. The NMOS transistor NMOS can include a gate terminal receiving the negative voltage VBB, a drain terminal receiving a high potential pumping voltage VPP as a driving voltage, a source terminal connected to a ground terminal VSS, and a bulk node receiving the gate-induced drain leakage current (Igidl). The bulk node of the NMOS transistor can be connected to one terminal of the resistor element R21.

The first transistor N21 can include a gate terminal receiving a bias voltage, a drain terminal connected to the other terminal of the resistor element R21, and a source terminal connected to a ground terminal VSS. The seventh inverter IV21 can include second and third transistors P21 and N22.

The second transistor P21 can include a gate terminal connected to a drain terminal of the first transistor N21 and a source terminal receiving an external voltage VDD. The third transistor N22 can include a gate terminal connected to the drain terminal of the first transistor N21, a drain terminal connected to a drain terminal of the second transistor P21, and a source terminal connected to a ground terminal VSS. The input terminal of the eighth inverter IV22 can be connected to the node where the drain terminal of the second transistor P21 and the drain terminal of the third transistor N22 are connected, wherein the output terminal of the eighth inverter IV22 can output the control signal 'ctrl'.

The NMOS transistor NMOS can include a gate-induced drain leakage current generating unit because the NMOS transistor NMOS includes the bulk node where the gate-induced drain leakage current (Igidl) is output. The eighth inverter IV22 may be a control signal generating unit since the eight inverter can output the control signal 'ctrl'.

An exemplary operation of he gate-induced drain leakage current detecting unit 400 will be described with reference to FIG. 4. The NMOS transistor NMOS can output a significant amount of the gate-induced drain leakage current (Igidl) when the level of the negative voltage VBB becomes high. The first transistor N21, which has a gate terminal receiving the bias voltage bias, can leak a portion (I1) of the gate-induced drain leakage current (Igidl) to a ground terminal VSS as a substantially constant amount. Accordingly, the first transistor N21 may be a current source.

When the amount of the remaining current (Igidl minus I1), which excludes the portion of the gate induced drain leakage current (Igidl), becomes larger, the voltage supplied to the gate terminal of the third transistor N22 increases so that the third transistor N22 can be turned ON. When the third transistor N22 is turned ON, the eighth inverter IV22 can output the control signal 'ctrl' that is enabled to a high level.

Figure 5A:
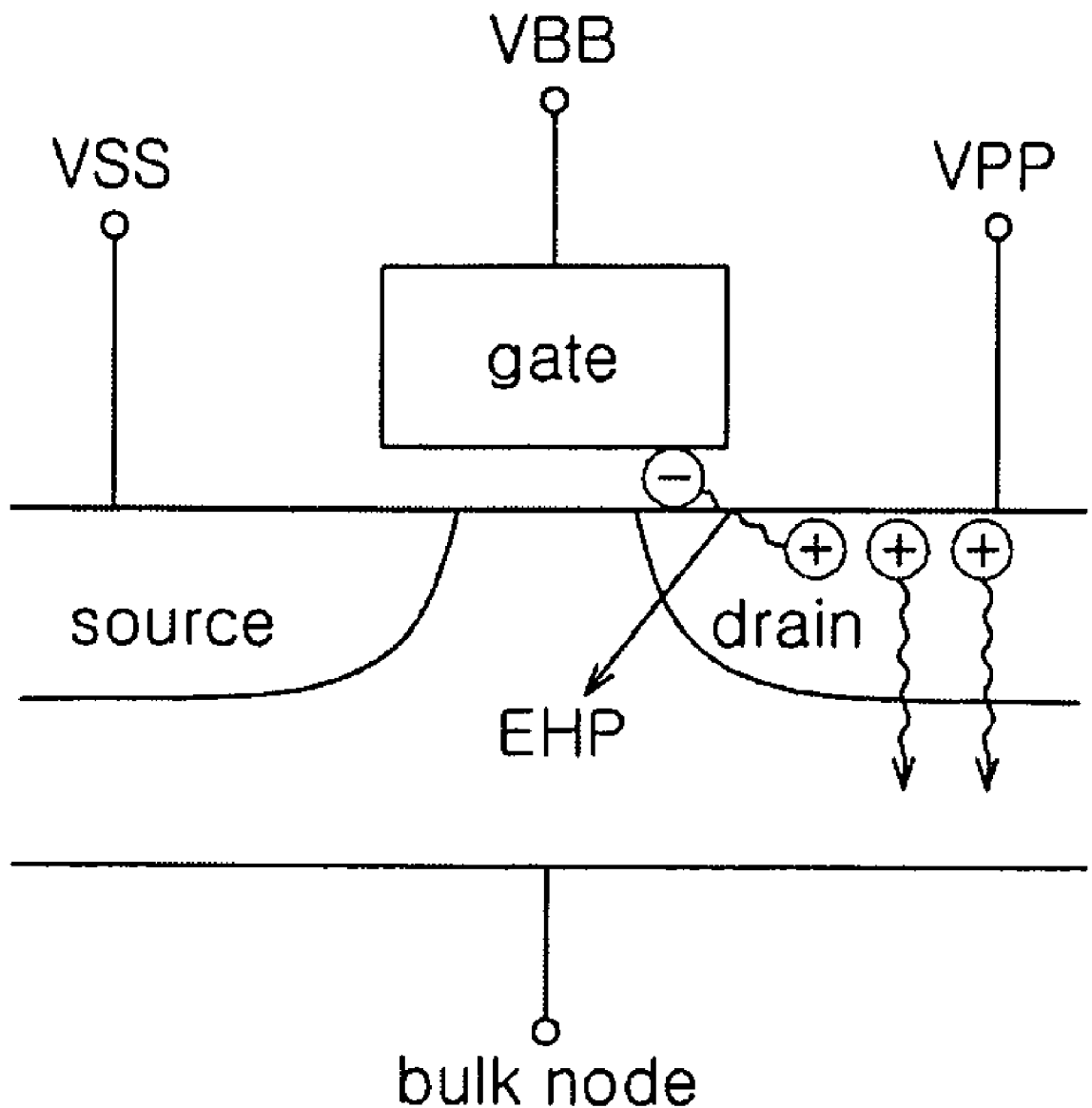
FIGS. 5A and 5B are cross-sectional views of an exemplary NMOS transistor capable of being implemented in the unit of FIG. 4 according to one embodiment.
Figure 5B:
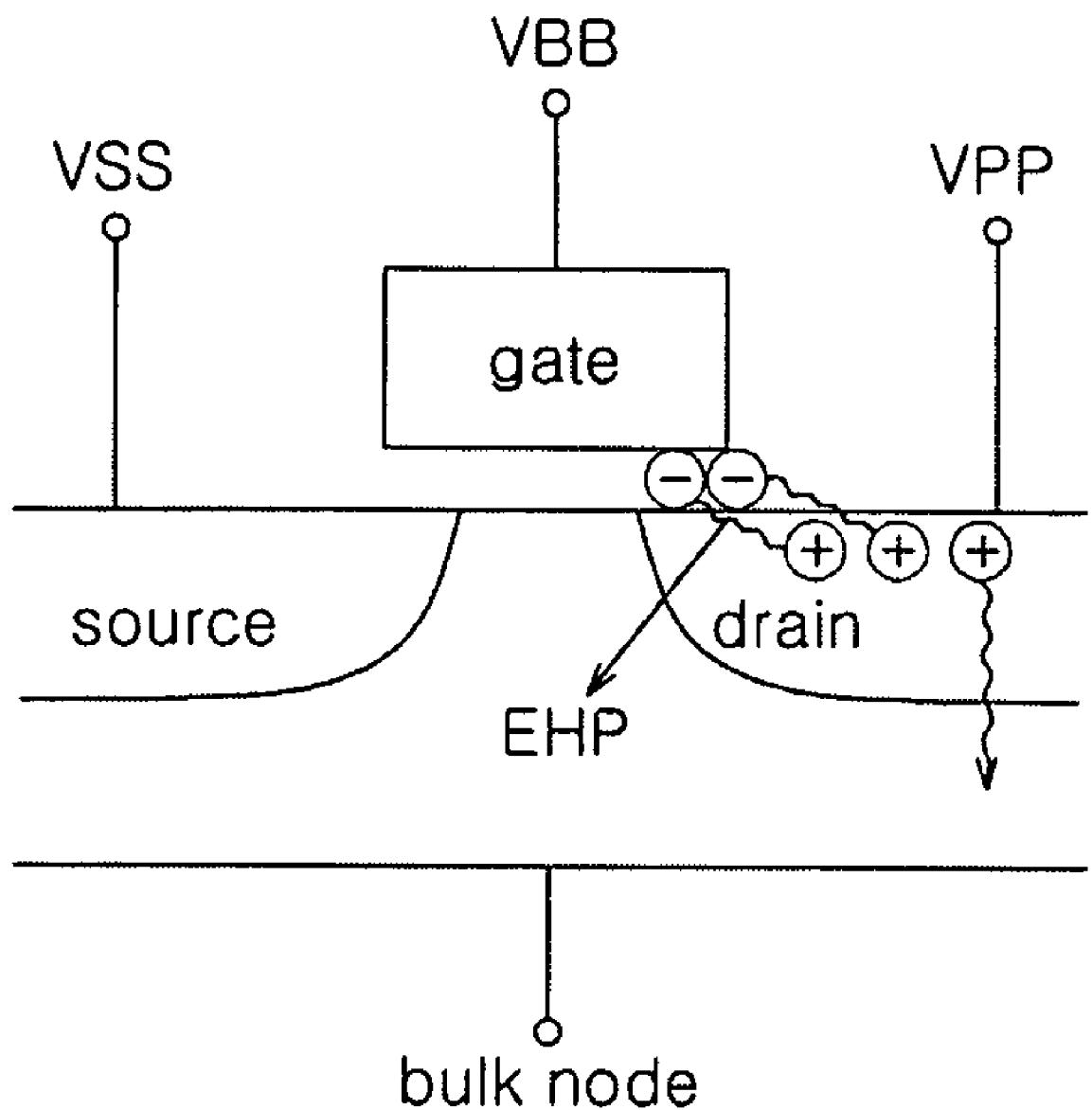

FIGS. 5A and 5B are cross-sectional views of an exemplary NMOS transistor capable of being implemented in the unit of FIG. 4 according to one embodiment. In FIGS. 5A and 5B, the NMOS transistor can include a gate terminal receiving the negative voltage VBB, a source terminal connected to a ground terminal VSS, and a drain terminal receiving a high potential pumping voltage VPP. Due to the negative voltage VBB and the high potential pumping voltage VPP, an electric field between the gate terminal and a drain region can be generated. Accordingly, an electron of the gate terminal and a hole of the drain region can combine with each other to generate an Electron-Hole Pair (EHP).

In FIG. 5A, the level of the negative voltage VBB is higher than the negative voltage VBB in FIG. 5B. The number of electrons combining with holes in FIG. 5A is smaller than the number of electrons combining with holes in FIG. 5B. Accordingly, since the number of holes flowing into the drain region of FIG. 5A is larger than the number of holes flowing into the drain region of FIG. 5B, the amount of the gate-induced drain leakage current (Igidl) output to the bulk node in FIG. 5A becomes larger than the amount of the gate-induced drain leakage current (Igidl) output to the bulk node in FIG. 5B.

An exemplary operation of a circuit for generating negative voltage of a semiconductor memory apparatus will be described with reference to FIGS. 2-5.

In FIG. 2, the negative voltage detecting unit 300 enables the detection signal 'det' when the level of the negative voltage VBB is higher than a target level. Accordingly, the variable period oscillator 100 generates the oscillator signal 'OSC' when the detection signal 'det' is enabled.

Then, the pump 200 performs pumping operations in response to the oscillator signal 'OSC', and generates the negative voltage VBB by the pumping operations. Since the negative voltage VBB is supplied to a bulk node of a transistor (in FIGS. 5A and 5B), the voltage level may rise due to the gate-induced drain leakage current outputted from the bulk node.

Although the pump 200 generates the negative voltage VBB, when the level of the negative voltage VBB rises due to the gate-induced drain leakage current, the gate-induced drain leakage current detecting unit 400 (in FIGS. 2 and 4) enables the control signal 'ctrl'.

The variable period oscillator 100, which receives the enabled control signal 'ctrl' as an input, outputs the oscillator signal 'OSC' of a period shorter, i.e., at a higher frequency, than when the control signal 'ctrl' is disabled. In the pump 200, which receives the oscillator signal 'OSC' of high frequency as an input, a pumping frequency becomes higher than when receiving the oscillator signal 'OSC' of low frequency as an input. Accordingly, the level of the negative voltage VBB becomes low.

An exemplary operation of a circuit for generating negative voltage will be described with reference to FIGS. 2-5.

In FIG. 2, the negative voltage detecting unit 300 enables the detection signal 'det' when the level of the negative voltage VBB becomes higher than a first target level. Accordingly, the variable period oscillator 100, which receives the enabled detection signal 'det' as an input, outputs the oscillator signal 'OSC'.

Then, the pump 200, which receives the oscillator signal 'OSC' as an input, performs pumping operations synchronous to the oscillator signal 'OSC' and generates the negative voltage VBB by the pumping operations. Although the pump 200 generates the negative voltage VBB, the level of the negative voltage VBB may rise because of the gate-induced drain leakage current. For example, even if the pump 200 generates the negative voltage VBB, the level of the negative voltage VBB may increase to be higher than the first target level. If the negative voltage VBB becomes higher than the second target level, which is higher than the first target level, then the control signal 'ctrl' is enabled and the variable period oscillator 100 generates the oscillator signal 'OSC' of higher frequency than when the control signal 'ctrl' is disabled. In the pump 200, which receives the oscillator signal 'OSC' of high frequency as an input, the pumping frequency becomes higher than when receiving the oscillator signal 'OSC' of low frequency as an input. Accordingly, the level of the negative voltage VBB becomes low.

The negative voltage VBB can be used as a bulk bias voltage of an NMOS transistor (in FIGS. 5A and 5B), in particular, among semiconductor devices composing a semiconductor memory apparatus.

Figure 6:
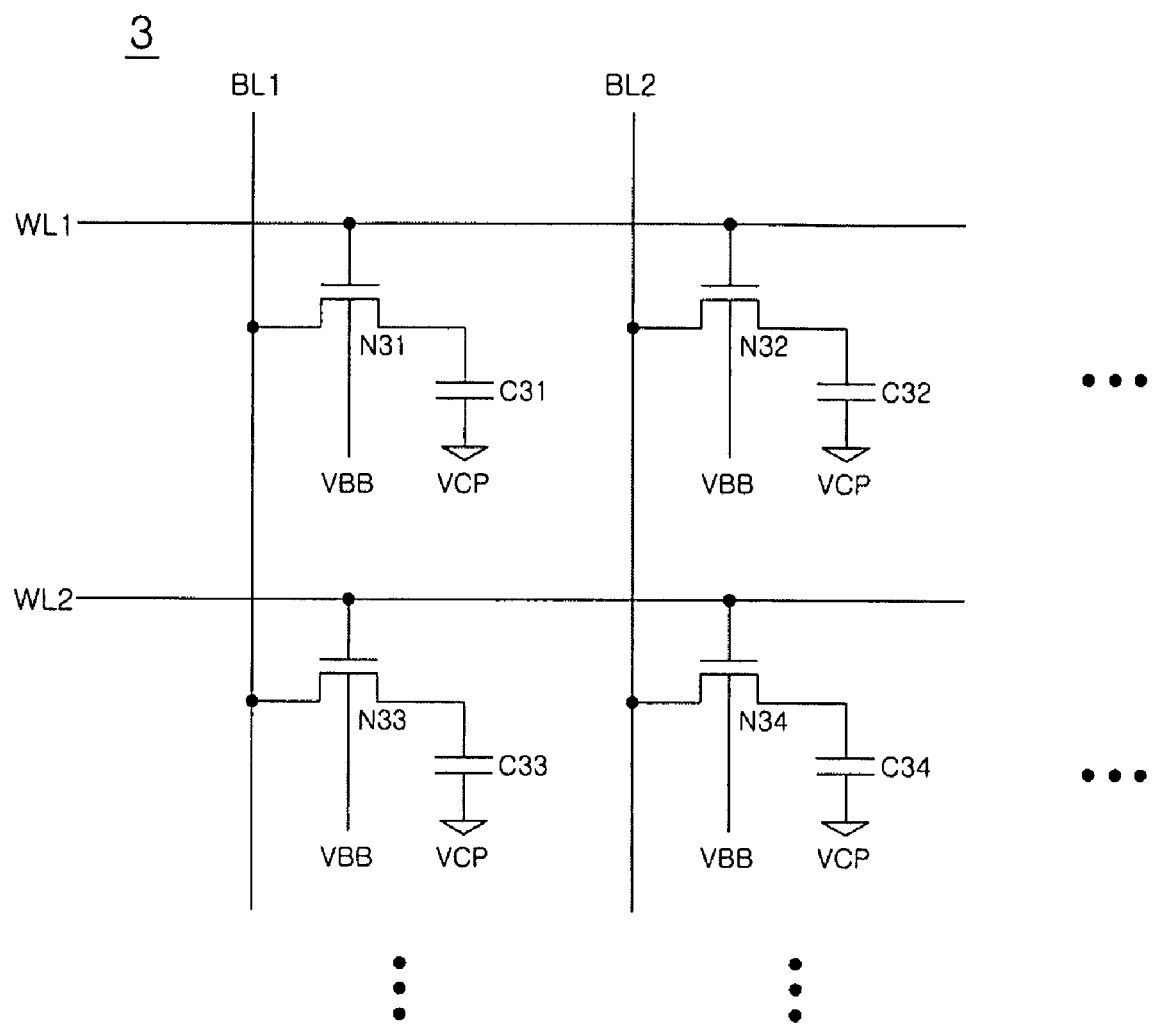
FIG. 6 is a schematic circuit diagram of an exemplary cell array of a semiconductor memory apparatus according to one embodiment.

FIG. 6 is a schematic circuit diagram of an exemplary cell array 3 of a semiconductor memory apparatus according to one embodiment. In FIG. 6, the cell array 3 can be configured as an internal circuit of a semiconductor memory apparatus to which the negative voltage VBB can be supplied as a bulk bias voltage.

The cell array 3 can include fourth to seventh transistors N31 to N34, and first to fourth capacitors C31 to C34. The fourth transistor N31 can include a gate terminal connected to a first word line WL1, a drain terminal connected to a first bit line BL1, a source terminal connected to one terminal of the first capacitor C31, and a bulk node receiving the negative voltage VBB. In addition, a cell plate voltage VCP can be supplied to the other terminal of the first capacitor C31.

The fifth transistor N32 can include a gate terminal connected to the first word line WL1, a drain terminal connected to a second bit line BL2, a source terminal connected to one terminal of the second capacitor C32, and a bulk node receiving the negative voltage VBB. In addition, the cell plate voltage VCP can be supplied to the other terminal of the second capacitor C32.

The sixth transistor N33 can include a gate terminal connected to a second word line WL2, a drain terminal connected to the first bit line BL1, a source terminal connected to one terminal of the third capacitor C33, and a bulk node receiving the negative voltage VBB. In addition, the cell plate voltage VCP can be supplied to the other terminal of the third capacitor C33.

The seventh transistor N34 can include a gate terminal connected to the second word line WL2, a drain terminal connected to the second bit line BL2, a source terminal connected to the fourth capacitor C34, and a bulk node receiving the negative voltage VBB. In addition, the cell plate voltage VCP can be supplied to the other terminal of the fourth capacitor C34.

Accordingly, a circuit for generating negative voltage can constantly maintain a current supply capability of negative voltage. In addition, a semiconductor memory apparatus can include a circuit for generating negative voltage can constantly maintain a current supply capability of negative voltage.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A circuit for generating negative voltage, comprising:
a variable period oscillator configured to generate an oscillator signal enabled in response to a detection signal and to determine a period of the oscillator signal in response to a control signal;
a pump configured to perform pumping operations in response to the oscillator signal and to generate a negative voltage by the pumping operations;
a negative voltage detecting unit configured to detect the level of the negative voltage to generate the detection signal; and
a leakage current detecting unit including an NMOS transistor configured to enable the control signal by detecting a leakage current output from a bulk node of the NMOS transistor.

2. The circuit for generating negative voltage of claim 1, wherein the NMOS transistor includes a gate terminal receiving the negative voltage, a drain terminal receiving a driving voltage, and a source terminal connected to a ground terminal.

3. The circuit for generating negative voltage of claim 2, wherein the driving voltage is configured to be a high potential pumping voltage.

4. The circuit for generating negative voltage of claim 3, wherein the gate-induced drain leakage current detecting unit includes:
the NMOS transistor;
an inverter configured to be connected to the bulk node of the NMOS transistor and to output the control signal; and
a current source configured to constantly leak a part of a current that flows through a node to which the NMOS transistor and the inverter are connected to a ground terminal.

5. The circuit for generating negative voltage of claim 4, wherein the current source is configured to include a transistor having a gate terminal receiving a bias voltage, a drain terminal connected to the node, and a source terminal connected to a ground terminal.

6. The circuit for generating negative voltage of claim 1, wherein when the detection signal is enabled and activated and the control signal is enabled, the variable period oscillator is configured to output the oscillator signal of a period shorter than when the control signal is disabled.

7. A circuit for generating negative voltage, comprising:
a variable period oscillator configured to generate an oscillator signal enabled in response to a detection signal and to determine the period of the oscillator signal in response to a control signal;
a pump configured to perform pumping operations in response to the oscillator signal and to generate a negative voltage by the pumping operations;
a first detecting unit configured to enable the detection signal when the level of the negative voltage becomes higher than a first target level; and
a second detecting unit configured to enable the control signal when the level of the negative voltage becomes higher than a second target level,
wherein the second detecting unit includes:
a gate-induced drain leakage current generating unit configured to generate a gate-induced drain leakage current in response to the level of the negative voltage; and
a control signal generating unit configured to enable the control signal when the amount of the gate-induced drain leakage current is larger than a predetermined amount.

8. The circuit for generating negative voltage of claim 7, wherein the first target level is configured to be lower than the second target level.

9. The circuit for generating negative voltage of claim 7, wherein the gate-induced drain leakage current generating unit is configured to increase the amount of the gate-induced drain leakage current when the level of the negative voltage increases.

10. The circuit for generating negative voltage of claim 9, wherein the gate-induced drain leakage current generating unit is configured to include an NMOS transistor to output the gate-induced drain leakage current from a bulk node of the NMOS transistor.

11. The circuit for generating negative voltage of claim 10, wherein the NMOS transistor includes a gate terminal receiving the negative voltage, a drain terminal receiving a driving voltage, and a source terminal connected to a ground terminal.

12. The circuit for generating negative voltage of claim 7, wherein the control signal generating unit includes:
a current source configured to constantly leak a part of the gate-induced drain leakage current to a ground terminal; and
an inverter configured to receive the gate-induced drain leakage current that excludes the current leaked to the ground terminal to generate the control signal.

13. The circuit for generating negative voltage of claim 7, wherein when the detection signal is enabled and activated and the control signal is enabled, the variable period oscillator is configured to output the oscillator signal of a period shorter than when the control signal is disabled.

14. A semiconductor memory apparatus, comprising:
a circuit for generating negative voltage including:
  a variable period oscillator configured to generate an oscillator signal enabled in response to a detection signal and to determine a period of the oscillator signal in response to a control signal:
  a pump configured to perform pumping operations in response to the oscillator signal and to generate a negative voltage by the pumping operations:
  a negative voltage detecting unit configured to detect the level of the negative voltage to generate the detection signal;
  an internal memory device circuit to which the negative voltage is supplied as a bulk voltage; and
  a gate-induced drain leakage current detecting unit configured to enable the control signal when the amount of a gate-induced drain leakage current output from a bulk node of an NMOS transistor becomes larger than a predetermined amount,
  wherein the NMOS transistor includes a gate terminal receiving the negative voltage, a drain terminal receiving a driving voltage, and a source terminal connected to a ground terminal.

15. The semiconductor memory apparatus of claim 14, wherein the internal memory device circuit includes a memory cell array.

16. The semiconductor memory apparatus of claim 14, wherein the driving voltage is configured to be a high potential pumping voltage.

17. The semiconductor memory apparatus of claim 16, wherein the gate-induced drain leakage current detecting unit includes:
  the NMOS transistor;
  an inverter configured to be connected to the bulk node of the NMOS transistor and to output the control signal; and
  a current source configured to constantly leak a part of a current that flows through a node to which the NMOS transistor and the inverter are connected to a ground terminal.

18. The semiconductor memory apparatus of claim 17, wherein the current source is configured to include a transistor having a gate terminal receiving a bias voltage, a drain terminal connected to the node, and a source terminal connected to a ground terminal.

19. The semiconductor memory apparatus of claim 14, wherein when the detection signal is enabled and activated and the control signal is enabled, the variable period oscillator is configured to output the oscillator signal of a period shorter than when the control signal is disabled.

20. A circuit for generating negative voltage, comprising:
  a variable period oscillator configured to generate an oscillator signal enabled in response to a detection signal and to determine a period of the oscillator signal in response to a control signal;
  a pump configured to perform pumping operations in response to the oscillator signal and to generate a negative voltage by the pumping operations;
  a negative voltage detecting unit configured to detect the level of the negative voltage to generate the detection signal;
  a transistor configured to enable the control signal when the amount of the gate-induced drain leakage current output from a bulk node of the transistor becomes larger than a predetermined amount;
  an inverter configured to be connected to the bulk node of the transistor and to output the control signal; and
  a current source configured to constantly leak a part of a current that flows through a node to which the transistor and the inverter are connected to a ground terminal.

21. The circuit for generating negative voltage of claim 20, wherein the transistor includes a gate terminal receiving the negative voltage, a drain terminal receiving a driving voltage, and a source terminal connected to the ground terminal.

22. The circuit for generating negative voltage of claim 20, wherein when the detection signal is enabled and activated and the control signal is enabled, the variable period oscillator is configured to output the oscillator signal of a period shorter than when the control signal is disabled.

* * * * *